United States Patent [19]
Foley et al.

[11] Patent Number: 5,145,540
[45] Date of Patent: Sep. 8, 1992

[54] CERAMIC COMPOSITION OF MATTER AND ITS USE

[75] Inventors: Paul Foley, Oldwick, N.J.; Rainer Buckpesch, Hofheim am Taunus, Fed. Rep. of Germany

[73] Assignee: Hoechst Aktiengesellschaft, Frankfurt am Main, Fed. Rep. of Germany

[21] Appl. No.: 601,861

[22] Filed: Oct. 23, 1990

[30] Foreign Application Priority Data

Oct. 25, 1989 [DE] Fed. Rep. of Germany ....... 3935471

[51] Int. Cl.$^5$ .......................... C03C 3/89; C03C 3/91; B32B 9/00
[52] U.S. Cl. ....................... 156/89; 501/66; 501/69; 501/72; 501/32; 428/209; 428/210; 428/433; 428/901
[58] Field of Search .................. 501/9, 17, 32, 64, 65, 501/66, 69, 72; 524/444, 560; 428/209, 210, 433, 901

[56] References Cited

U.S. PATENT DOCUMENTS

| | | | |
|---|---|---|---|
| 4,746,346 | 5/1988 | Murakami et al. | 65/43 |
| 4,849,379 | 7/1989 | McCormick | 501/20 |
| 4,849,380 | 7/1989 | Sawhill | 501/20 |
| 4,939,021 | 7/1990 | Aoki et al. | 428/209 |
| 4,961,998 | 10/1990 | Senkalski et al. | 428/426 |
| 5,024,975 | 6/1991 | Hartmann | 501/65 |

FOREIGN PATENT DOCUMENTS

204261 12/1986 European Pat. Off. .
2108103 5/1983 United Kingdom .

*Primary Examiner*—William R. Dixon, Jr.
*Assistant Examiner*—Michael Marcheschi
*Attorney, Agent, or Firm*—Curtis, Morris & Safford

[57] ABSTRACT

A ceramic composition of matter which is sinterable at low temperatures is composed of
a) 40 to 90% by weight of a finely disperse, high-melting oxidic material and
b) 10 to 60% by weight of a finely disperse glass having a softening point of 500° to 850° C., a coefficient of thermal expansion (=CTE) of 2 to $5 \times 10^{-6}$ K$^{-1}$ (measured in the interval from 0° to 400° C.) and a dielectric constant of less than 5 (measured at $10^6$ Hz and 20° C.). The finely disperse oxidic material is composed of a mixture of MgO, Al$_2$O$_3$ and SiO$_2$ in an Al$_2$O$_3$/MgO weight ratio of 1.8–4 with an SiO$_2$ weight fraction of 42–65% by weight or an equivalent quantity of corresponding oxide precursors which, on heating, decompose to give these oxides. The MgO or the MgO precursor has a mean grain size of 0.05 to 3 μm and the SiO$_2$ or the SiO$_2$ precursor has a mean grain size of 2 to 20 μm. The composition sinters at 900°–1100° C. and is suitable for producing substrates or metallized housings.

9 Claims, 1 Drawing Sheet

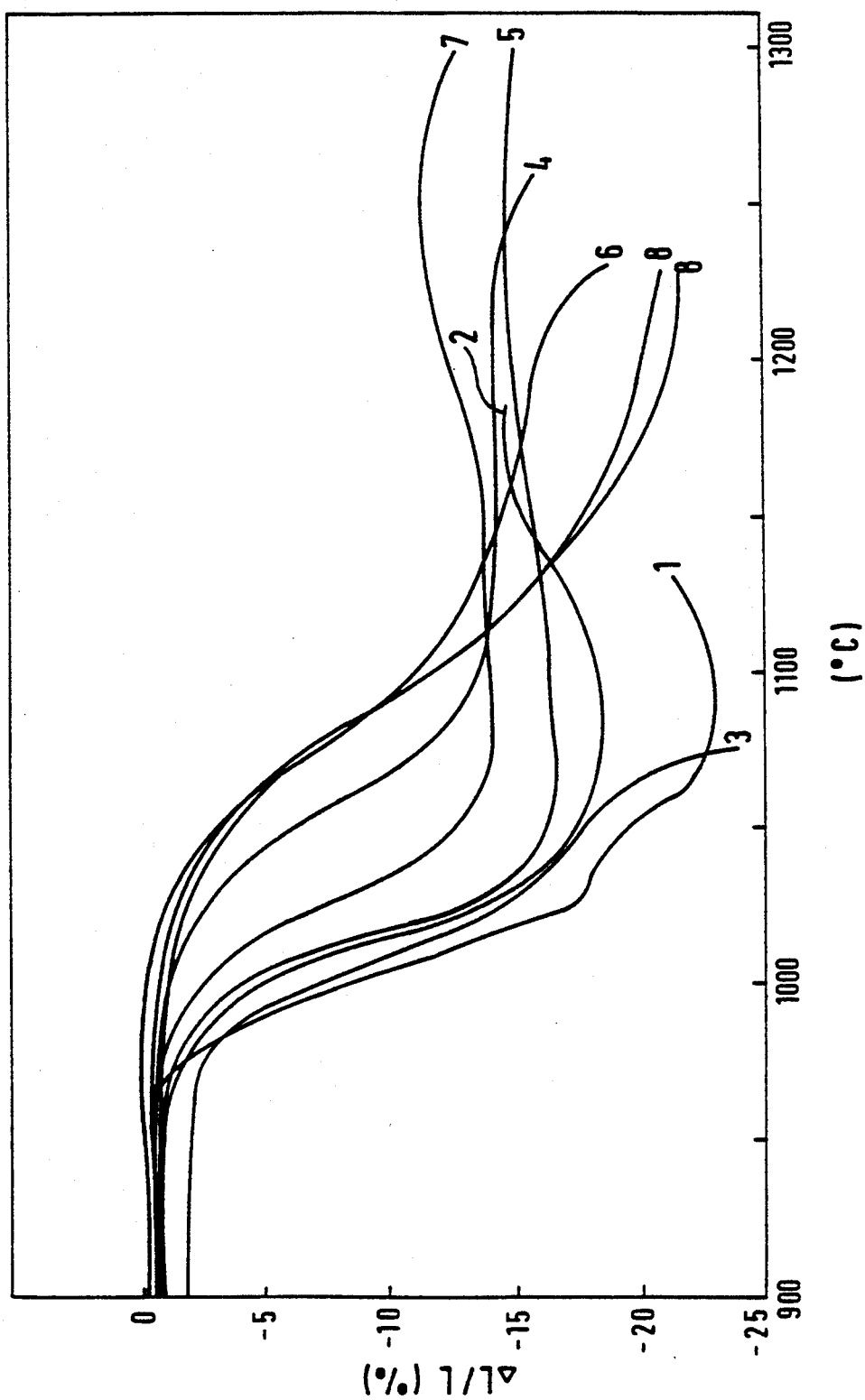

CERAMIC COMPOSITION OF MATTER AND ITS USE

DESCRIPTION

The invention relates to a ceramic composition of matter which is sinterable at low temperatures, to the substrates and multi-layer housings for microelectronics produced therefrom and also to a process for the production thereof.

Ceramic compositions of matter are used very widely in the production of electrical circuit elements and devices, for example in the production of multi-layer ceramic structures which in general are composed of a number of layers of a ceramic insulating material with interposed stratiform patterns of metal (so-called multi-layer ceramics).

In addition, single-layer ceramic platelets (so-called substrates) are also of importance. The platelets should have a low dielectric constant and a low coefficient of thermal expansion, so that they are suitable as a carrier material for high-frequency circuits. These parameters depend essentially only on the chemical composition.

U.S. Pat. No. 4,528,275 has already disclosed a mullite silicate glass composition which is suitable as a substrate material and whose coefficient of thermal expansion corresponds approximately to that of silicon. In the same document, the production of a substrate material is described which is composed of mullite and cordierite but does not contain a coherent glass phase.

U.S. Pat. No. 4,413,061 has disclosed a process for producing substrates, in which special glasses are, with addition of a nucleating agent, fused and heat-treated. Materials which do not melt under these conditions are not mentioned. In this process, a part of the glass is converted to α-cordierite, and substrates of sintered glass ceramic are formed.

German Offenlegungsschrift 2,460,931 has disclosed compositions of matter which, on sintering, lead to ceramic bodies having a low dielectric constant and which are composed of a polycrystalline, ceramic refractory material and a glass arranged in the interspatial region. To produce the sinterable composition, a refractory material, for example cordierite, and a glass of low sintering temperature, low dielectric constant and small thermal expansion, for example borosilicate glass, are thoroughly mixed in a finely disperse form and sintered. During sintering, the glass melts and fills the cavities between the refractory particles in the interspatial region.

The invention is based on the observation that the production of ceramic sintered bodies is facilitated if the starting material used is not cordierite, but a mixture of $Al_2O_3$, finely disperse magnesium oxide and coarse particles of silica.

The invention therefore relates to a ceramic composition of matter, which is sinterable at low temperatures and is composed of 40 to 90% by weight of a finely disperse, high-melting oxidic material and 10 to 60% by weight of a finely disperse glass having a softening point of 500° to 850° C., a coefficient of thermal expansion (=CTE) of 2 to $5 \times 10^{-6} K^{-1}$ (measured in the interval from 0 to 400° C.) and a dielectric constant of less than 5 (measured at $10^6$ Hz and 20° C.). In this composition of matter, the finely disperse oxidic material is composed of MgO, $Al_2O_3$ and $SiO_2$ in an $Al_2O_3/MgO$ weight ratio of 1.8–4 with an $SiO_2$ weight fraction of 42–65% or an equivalent quantity of corresponding oxide precursors which, on heating, decompose to give these oxides, and the MgO or the MgO precursor has a mean grain size of 0.05 to 3 μm ($d_{50}$ value) and the $SiO_2$ or the $SiO_2$ precursor has a mean grain size of 2 to 20 μm ($d_{50}$ value).

The $SiO_2$ fraction amounts preferably to 43–60% by weight, especially 43–55% by weight. The $Al_2O_3/MgO$ weight ratio is preferably 2–3, especially 2.2–2.7 and with particular preference 2.4–2.6.

The mean grain size of the magnesium oxide powder (or the corresponding precursor) used in sintering is preferably in the range from 0.1 to 3 μm ($d_{50}$ value). The mean grain size of the $SiO_2$ powder used in sintering is preferably 10 to 20 μm ($d_{50}$ value).

The grain size of the alumina powder used appears not to have any significant effect on the sintering properties. The grain size can, for example, be in the range between 0.5 and 25 μm. For producing a flexible green ceramic sheet with the least possible organic auxiliaries, the specific surface area of the powders used should not be unduly large, since otherwise the binder requirement becomes too great. Specific surface areas of the powders used from 1 to 20 $m^2/g$, especially 1 to 10 $m^2/g$, are preferred.

When the composition according to the invention is heated, the oxides or oxide precursors react to form cordierite. The higher the proportion of cordierite formed, the more advantageous are the thermal shock resistance and the electronic properties.

ε is improved by an excess of free $SiO_2$ in the glass ceramic, but the CTE deteriorates.

Batches with finely disperse MgO show (independently of the $SiO_2$) a lower sintering temperature $T_1$, a low sintering end $T_2$ and a smaller sintering range $(T_2-T_1)$ than batches with coarse magnesium oxide. Moreover, a combination of fine magnesium oxide and coarse $SiO_2$ leads to a considerable increase in the softening temperature $T_s$. On the other hand, the grain size of the alumina does not influence the sintering parameters. It is an advantage of the ceramic composition according to the invention that the available working interval $(T_s-T_2)$ is large. A working interval of at least 50 K is readily achievable.

Examples of oxide precursors for magnesium oxide are magnesium hydroxide and magnesium carbonate. Examples of oxide precursors for $Al_2O_3$ are bauxite (AlOOH) or $Al(OH)_3$. The silica can be used in the form of quartz, cristobalite, amorphous quartz or tridymite.

As already described in U.S. Pat. No. 4,413,061, glass ceramics are superior for certain applications to pure alumina whose dielectric constant ($\epsilon = 10$) is too high for many purposes.

After sintering, the ceramic composition according to the invention gives a ceramic body which is composed of a skeleton of the ceramic refractory material and a glass which fills the intergranular regions. The finely disperse, polycrystalline refractory material used, which is composed of MgO, $Al_2O_3$ and $SiO_2$, is converted to cordierite which likewise has a low dielectric constant ($\epsilon = 4.5$–5.1). The refractory skeleton formed on sintering essentially confers the necessary flexural strength on the material. The refractory material and the glass together are responsible for the low dielectric constant and the low electric losses at high frequencies. The glass constituent is mainly responsible for the low sintering temperature, the good chemical resistance and the high electrical insulation resistance of the ceramic molding formed on sintering.

Dense glass ceramic moldings, which are very suitable as a carrier material for electronic components, can be obtained by sintering from the composition according to the invention.

The composition according to the invention allows sheets of unfired ceramic to be produced which sinter simultaneously with an applied metallization. This is important, for example, in the formation of multi-layer structures, so-called multi-layer packages. In this case, it is necessary to use high-melting rare metals such as, for example, platinum or palladium for the metallization. Base metals such as tungsten or molybdenum require a reducing atmosphere to be maintained during sintering. A further disadvantage is the low electrical conductivity of these metals. The compositions according to the invention can be densified at low temperatures in either an oxidizing or a reducing atmosphere and simultaneously bonded to metallizations which show excellent electrical conductivity, such as, for example, copper, silver, gold or alloys thereof with Pt or Pd, for example Ag-Cu, Ag-Pd, Au-Pd or Au-Pt.

Since the novel ceramic compositions of matter can readily be sintered to a high density (closed pore volume less than 5%), they can be used for producing layers which are absolutely impermeable to gases and liquids and are therefore suitable for hermetic seals, in particular for interfaces between ceramic materials and metals.

The glass, located in the intergranular region, of the ceramic sintered body has two functions, according to the present invention. On the one hand, it serves as a binder for the refractory material and, on the other hand, it acts as a flux in liquid-phase sintering and really makes the densification of the composition at low temperatures possible. Because of the low softening point of 500° to 850° C. of the glass phase, sintering temperatures from 900° to 1100° C., especially 900° to 1000° C., are possible. After the molding obtained on sintering has cooled, the glass is responsible for the shape stability and dimensional stability of the bodies. Softening of the sintered body at temperatures below 500° C. is a disadvantage, since otherwise there is a risk of the component being deformed during later processing steps. Therefore, the softening point of the glass phase also should not be below 500° C.

With an increasing weight fraction of glass in the composition according to the invention (within the range from 10 to 60% by weight), the sintering temperature ($T_2$) and the softening point $T_s$ decrease, but the latter to a substantially greater extent. The difference of the two temperatures therefore becomes smaller. For this reason, the glass fraction will be selected at such a level that a sintering temperature is reached which is somewhat lower than the sintering temperature of the metal in the metal paste used and, on the other hand, the softening point $T_s$ is at least 50 K, preferably at least 100 K, higher than the sintering temperature.

Preferably, the glass used has a coefficient of thermal expansion from 2.5 to $4.5 \times 10^{-8}$ K$^{-1}$. The dielectric constant of the glass is preferably smaller than 4.5. Those glasses are preferred which have good chemical resistance and also do not show any changes in reducing atmospheres. For this special application, glasses having a content of ZnO, $SnO_2$, PbO or iron oxides are disadvantageous.

The glass located in the intergranular region makes possible a high apparent density, which is at least 93% of that theoretically achievable, on sintering. For producing a molding, in particular a single-layer substrate or a multi-layer housing, the composition according to the invention is mixed with organic auxiliaries, for example dispersants, binders, plasticizers, release agents and, if appropriate, antifoams and solvents. A thin layer of the unfired material (green body) is produced from this mixture by casting or another shaping method. A geometrical pattern of a composition which is conductive or becomes conductive on sintering is applied, for example by screen printing, to the surface of the green sheet thus produced As the metallizing material, a metal or an alloy is selected, the paste of which can be burned in at the sintering temperature. These are in general pastes of gold, gold/Pt and Ag/Pd. Copper pastes can also be used; in this case, however, burning-in with exclusion of oxygen is necessary.

When substrates are produced by dry pressing, the organic fraction is about 0.5 to 3% by weight. When flexible green ceramic sheets are produced, the fraction of organic auxiliaries is 5 to 20% by weight, and the fraction of ceramic composition of matter according to the invention is 80 to 95% by weight. The sheet thickness is in most cases 0.1 to 2 mm, especially 0.1 to 1 mm.

The ceramic green sheet thus produced can, with an appropriate thickness, be fired directly to give a single-layer substrate having a thickness of about 0.3–1.5 mm, with or without metallization.

For producing multi-layer- housings from green sheets, which are composed of ceramic powder and organic additives, for example binder, a multiplicity of cards are punched out of the sheets, these cards are, if appropriate, provided with holes which are then filled with metal paste and later give a conductive connection through the card, and are then coated with a paste which contains a high-melting metal such as silver, copper, gold or tungsten in addition to binder and solvent, for example by screen printing or lithographically, a geometrical structure being formed. At least two of these green cards printed with metal paste are stacked up, so that a sandwich structure is formed, and are laminated together (i.e. compressed briefly at elevated temperature). The laminate obtained is heated up slowly in order to remove the organic constituents, and then heated further to a temperature of 900°–1100° C., in particular 900°–1000° C. The ceramic composition of the sheet thus sinters to give a glass ceramic, and the metal fraction of the paste sinters to give an electrically conductive track.

A suitable firing base is, for example, a metal plate or a plate of mullite or alumina, whose roughness should correspond to the surface of the desired molding. The surface of the fired ceramic can not be better with respect to roughness or curvature than is permitted by the nature of the firing base. Firing bases of molybdenum or tungsten sheets are suitable for firing in reducing atmospheres.

Glasses having a dielectric constant of at most 5 at $10^6$ Hz and 20° C. are known to those skilled in the art. Mainly, borosilicate glasses or aluminum borosilicate glasses, including binary, ternary or quaternary glasses, are used, for example from the systems $B_2O_3$-$SiO_2$, $Al_2O_3$-$B_2O_3$-$SiO_2$ or $Li_2O$-$Al_2O_3$-$B_2O_3$-$SiO_2$ (lithium borosilicate glass). Boron phosphate glasses and lithium tetraborate glasses can also be used. A lithium borosilicate glass with contents of $K_2O + Na_2O$ is indicated in German Offenlegungsschrift 2,460,931, page 22.

In N. P. Bansal and R. H. Doremus, Handbook of Glass Properties, Academic Press, 1986, a sodium borosilicate glass (Table 14.38), a lithium silicate glass (Table 14.1) and several industrial glass types from Corning Glass Works are mentioned (Corning No. 3320, 7040, 7070 and 7720—Table 3.9). Further useful glasses are listed in Encyclopedia of Glass, Ceramics and Cement, John Wiley, 1985, pages 481–486, Tables 3 and 4.

It is advantageous when the glass used contains only a little alkali metal ions, especially sodium ions and potassium ions. A content of at most 0.01% by weight of sodium oxide + potassium oxide is preferred. Preferably, the glass fraction is 20 to 40% by weight (remainder: refractory material). The higher the percentage glass fraction in the composition, the lower are the sintering temperature and the dielectric constant.

These materials which can be densified at low sintering temperatures bring about the following advantages, especially in multi-layer technology:

Low sintering temperatures, i.e. cost savings

Simple sintering profiles, both oxidizing and reducing atmospheres (hydrogen) are possible Use of simple continuous furnaces is possible.

The use of corrosion-resistant metal pastes of high electrical conductivity is possible.

The lower dielectric constant of the ceramic carrier material according to the present invention leads to a markedly smaller signal delay.

A value better adapted to the coefficient of thermal expansion of silicon, which leads to markedly lower strains between the substrate material and the silicon chip under alternating temperature stresses. Using this substrate material, the trend towards the use of larger silicon chips can therefore be followed.

The materials on which the invention is based have a markedly higher thermal shock resistance than the alumina nowadays used predominantly.

The lower hardness of the material makes further treatment easier, such as, for example, lapping, polishing, through-hole plating, for example by means of a laser.

For producing ceramic sintered bodies with stringent demands on the dimensional tolerances, the exact shrinkage of the green sheet on firing must be known and exactly adhered to, since subsequent treatment as a rule involves high costs.

The organic auxiliaries necessary for shaping of the green sheets are expelled at temperatures up to 500° C.

The sintering temperature of less than 950° C. can be reached after a heating-up time from a few minutes up to at most one hour. For complete densification of the ceramic body, a holding time at the maximum temperature of at least one hour is necessary. If a continuous furnace with a conveyor belt is used, the passage speed of the belt in the furnace must be adjusted such that the organic auxiliaries are completely removed before the actual sintering process starts. It must also be ensured that the highest possible heating-up rate (that is the rate at which harmful cracks or blisters just do not yet appear in the end product) is not exceeded and the holding time is not less than that necessary.

The ceramic single-layer substrate (with and without metallization) obtained after sintering or the multilayer housing with metallization can be further processed by the otherwise conventional fabrication processes to give IC housings. For example, the conductor tracks located on the outside can also be chromium- and gold-plated.

The invention is explained by the examples which follow.

EXAMPLE 1 (COMPARISON EXAMPLE)

Magnesium oxide (particle size distribution relative to weight fractions: $d_{10}=1.5$ µm, $d_{50}=18.5$ µm, $d_{90}=38.8$ µm), alumina (particle size distribution: $d_{10}=1.6$ µm, $d_{50}=3.7$ µm, $d_{90}=6.4$ µm) and quartz (particle size distribution: $d_{10}=1.9$ µm, $d_{50}=18.2$ µm and $d_{90}=50$ µm) were combined in a weight ratio of 15.4% by weight of MgO, 45.8% by weight of $SiO_2$ and 38.8% by weight of $Al_2O_3$ and thoroughly mixed. Pulverulent lithium borosilicate glass (particle size distribution: $d_{10}=1.8$ µm, $d_{50}=8.1$ µm and $d_{90}=32.2$ µm, glass transformation point 491° C.) was added to the powder mixture in an oxide mixture/glass weight ratio of 70/30. This mixture was ground in the presence of isopropanol for 4 hours in an attritor mill in the presence of alumina grinding plates. The isopropanol was removed in vacuo and the powder was dried at 200° C. The particle size distribution for the four-component powder mixture then showed the following values: $d_{10}=0.51$ µm, $d_{50}=2.1$ µm and $d_{90}=4.8$ µm.

The dried powder was isostatically pressed to give a cylindrical specimen and sintered at 1075° C. The heating-up rate was here (as in the other examples) 5° C./minute, without stopping when the sintering temperature was reached. The ceramic obtained showed a dilatometrically measured softening point of 1154° C. and a processing range of 79 K (=difference between softening point and sintering temperature). The properties of the glass ceramic obtained (with the exception of the sintering parameters) are listed in Table 1. As a first approximation, they also apply to the ceramics of the other examples. The X-ray diffraction spectrum showed that cordierite, mullite and sapphirine were present as ceramic phases.

TABLE 1

| Properties | Glass ceramic |
|---|---|
| Water solubility | low |
| Thermal conductivity (W/m K) | about 2.3 |
| Bending fracture strength (MPa) | about 189 |
| Modulus of elasticity (GPa) | about 101 |
| Reduction stability | good |
| Thermal shock resistance | >400° C. |
| Dielectric constant (1 MHz) | about 5.0 |
| Tan δ (1 MHz) | about $2.9 \times 10^{-3}$ |
| Resistance (ohm cm) | $>10^{+9}$ |
| Crystal phases | cordierite, mullite, sapphirine |

EXAMPLE 2

Example 1 was repeated, but the quartz in the sintering mixture was coarser. The magnesium oxide, alumina and glass powder were ground as in Example 1. The particle size distribution of the powder mixture obtained was: $d_{10}=0.51$ µm, $d_{50}2.1$ µm and $d_{90}=4.8$ µm. Quartz (particle size distribution: $d_{10}=1.9$ µm, $d_{50}=18.2$ µm and $d_{90}=50$ µm) was then added to this mixture and the powder was mixed for 15 minutes.

The specimen cylinder obtained analogously sintered at 1036° C. and gave a dense ceramic body. The latter showed a softening point of 1317° C., which corresponds to a processing range of 281 K.

EXAMPLE 3

Example 2 was repeated, but a pause of 2 hours was inserted during heating when a temperature of 1000° C. was reached. A dense-sintered ceramic body was obtained which had the same properties as the ceramic body of Example 2.

EXAMPLE 4 (COMPARISON EXAMPLE)

Example 1 was repeated, but the particle size of both magnesium oxide and quartz in the sintering mixture was greater. Alumina and lithium borosilicate glass were ground in isopropanol as in Example 1. A powder having the following particle size distribution was formed: $d_{10}=0.51$ μm, $d_{50}=2.1$ μm and $d_{90}=4.8$ μm. Quartz (particle size distribution: $d_{10}=1.9$ μm, $d_{50}=18.2$ μm and $d_{90}=50$ μm) and magnesium oxide from Example 1 were added to this mixture. The weight ratio of the four components was unchanged as compared with Example 1. The mixture obtained was homogeneously mixed for 15 minutes and then the solvent was removed. A molding produced by isostatic pressing sintered at 1172° C. to give a dense ceramic body having a softening point of 1229° C. This corresponds to a processing range of 57 K.

EXAMPLE 5

Example 2 was repeated, but the grain size of the alumina used was greater. Magnesium oxide and lithium borosilicate glass were ground in isopropanol. The powder mixture obtained had the following particle size distribution: $d_{10}=0.51$ μm, $d_{50}=2.1$ μm and $d_{90}=4.8$ μm. Quartz (particle size distribution as in Example 2) and alumina ($d_{10}=4$ μm, $d_{50}=25$ μm and $d_{90}=50$ μm) were added to this mixture. The weight fractions of the four components were unchanged as compared with Example 1. The suspension obtained was mixed for 15 minutes and then the solvent was removed. A molding obtained by isostatic pressing sintered at 1050° C. to give a dense ceramic body. A softening point of 1332° C. was measured, which corresponds to a processing range of 282 K.

EXAMPLE 6

Example 4 was repeated, but the grain size of the alumina was greater. Only the lithium borosilicate glass from Example 1 was ground for 3.75 hours in isopropanol. The particle size distribution was: $d_{10}=0.51$ μm, $d_{50}=2.1$ μm and $d_{90}=4.8$ μm for the powder obtained. Quartz and magnesium oxide (as in Example 1) and alumina (as in Example 4) were added to this mixture. The suspension was mixed for 15 minutes until homogeneous. The weight fractions of the four components were as in Example 1. After removal of the solvent by evaporation in vacuo and drying, the powder was isostatically shaped into a molding and sintered at 1174° C. to give a dense ceramic molding. This body showed a softening point of 1227° C., which corresponds to a processing range of 53 K.

EXAMPLE 7

Mixtures of MgO, $Al_2O_3$, $SiO_2$ and glass were pressed and sintered in the weight ratios of Example 1. The sintering step was followed dilatometrically. The mean grain size of the glass was 2 μm in all cases. The mean grain size of the oxides is shown in Table 2:

TABLE 2

| Experiment | MgO | $Al_2O_3$ | $SiO_2$ |
|---|---|---|---|
| 1 | 2 μm | 3.7 μm | 2 μm |
| 2 | 18.5 | " | " |
| 3 | 2 | 25 μm | " |
| 4 | 18.5 | " | " |
| 5 | 2 | 3.7 | 18.2 μm |
| 6 | 18.5 | " | " |
| 7 | 2 | 25 | " |
| 8 | 18.5 | " | " |

The dilatometer curves obtained are shown in the figure. The ordinate shows the shrinkage $\Delta L/L$ in %, and the abscissa shows the temperature in °C. Experiments 5 and 7 are according to the invention.

We claim:

1. A ceramic composition of matter, which is sinterable at low temperatures, comprising
  a) 40 to 90% by weight of a finely dispersed, high-melting oxidic material and
  b) 10 to 60% by weight of a finely dispersed glass having a softening point of 500° to 850° C., a coefficient of thermal expansion of 2 to $5 \times 10^{-6}$ $K^{-1}$ measured in the interval from 0° to 400° C., and a dielectric constant of less than 5 measured at $10^6$ Hz and 20° C., wherein the finely dispersed oxidic material comprises MgO, $Al_2O_3$ and $SiO_2$ in an $Al_2O_3$/MgO weight ratio of 1.8–4 with an $SiO_2$ weight fraction of 42–65% by weight, or an equivalent quantity of corresponding oxide precursors which, on heating, decompose to give these oxides, and the MgO or the MgO precursor has a mean grain size of 0.05 to 3μm, and the $SiO_2$ or the $SiO_2$ precursor has a mean grain size of 2 to 20 μm.

2. A composition as claimed in claim 1, wherein the finely dispersed glass used is a borosilicate glass.

3. A composition as claimed in claim 1, wherein the finely dispersed glass used is a lithium borosilicate glass.

4. A composition as claimed in claim 1, wherein a glass is used which is free of zinc oxide and lead oxide.

5. A green ceramic sheet of 0.1 to 2 mm thickness, containing 5 to 20% by weight of organic components and 80 to 95% by weight of a finely dispersed, sinterable ceramic intermediate, wherein the ceramic intermediate is the ceramic composition of matter as claimed in claim 1.

6. A process for producing a glass-ceramic substrate, which comprises mixing the composition as claimed in claim 1 with organic auxiliaries, shaping the mixture to give a thin stratiform molding, slowly heating the green molding until the organic auxiliaries have been removed, and then sintering at a temperature from 900° to 1100° C., especially 900° to 1000° C.

7. A process according to claim 6 wherein the sintering is conducted at a temperature of from 900° to 1000° C.

8. A process for producing a multi-layer housing from glass ceramics, which comprises preparing at least 2 ceramic green sheets as claimed in claim 5, generating a stratiform geometrical structure on the surface of at least two of said green sheets with the use of a metallization paste which contains metal powder, binder and a solvent, stacking up the individual green sheets to form a sandwich structure, laminating the green sheets together, heating the laminate in order to remove the organic constituents and then further heating to a temperature of 900°–1100° C., so that the ceramic intermediate sinters together to give a glass ceramic and the metal particles of the paste sinter together to give an electrically conductive track.

9. The process as claimed in claim 8, wherein a metallization paste is used, the metal fraction of which sinters at 800°–1000° C.

* * * * *